United States Patent
Ando et al.

(10) Patent No.: US 8,564,066 B2
(45) Date of Patent: Oct. 22, 2013

(54) INTERFACE-FREE METAL GATE STACK

(75) Inventors: Takashi Ando, Tuckahoe, NY (US);
Kisik Choi, Hopewell Junction, NY (US); Matthew W. Copel, Yorktown Heights, NY (US); Richard A. Haight, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 12/818,828

(22) Filed: Jun. 18, 2010

(65) Prior Publication Data
US 2011/0309449 A1 Dec. 22, 2011

(51) Int. Cl.
*H01L 21/70* (2006.01)

(52) U.S. Cl.
USPC 257/369; 257/410; 257/E21.19; 257/E27.062; 257/E29.255; 438/592

(58) Field of Classification Search
USPC .......................... 257/396, E21.621; 438/585
See application file for complete search history.

(56) References Cited

U.S. PATENT DOCUMENTS

| | | |
|---|---|---|
| 7,462,538 B2 | 12/2008 | Li et al. |
| 7,488,656 B2 | 2/2009 | Cartier et al. |
| 7,564,108 B2 | 7/2009 | Wang et al. |
| 8,119,473 B2 * | 2/2012 | Huang et al. ............ 438/199 |
| 2008/0157208 A1 | 7/2008 | Fischer et al. |
| 2008/0157224 A1 | 7/2008 | Fischer et al. |
| 2009/0090979 A1 | 4/2009 | Zhu et al. |
| 2009/0117750 A1 | 5/2009 | OuYang et al. |
| 2010/0244141 A1 * | 9/2010 | Beyer et al. ............ 257/369 |
| 2012/0086075 A1 * | 4/2012 | Huang et al. ............ 257/334 |

OTHER PUBLICATIONS

"Oxygen Passivation of Vacancy Defects In Metal-Nitride gated Hf02/Si 02/Si Devices", E. Cartier et al. Appl. Phys. Lett. 95, 042901 (2009).*
"Quasi-Damascene Metal Gate/High-k CMOS Using Oxygenation Through Gate Electrodes", Choi, et al, Microelectronic Engineering, 86, 1737, (2009).*
"Quasi-Damascene Metal Gate/High-k CMOS Using Oxygenation Through Gate Electrodes", Choi, et al., Microelectronic Engineering, 86, 1737, (2009).*

* cited by examiner

*Primary Examiner* — Daniel Luke
*Assistant Examiner* — Edward Chin
(74) *Attorney, Agent, or Firm* — Thomas Grzesik; Fleit Gibbons Gutman Bongini & Bianco PL

(57) ABSTRACT

A method of fabricating a gate stack for a transistor includes forming a high dielectric constant layer on a semiconductor layer. A metal layer is formed on the high dielectric constant layer. A silicon containing layer is formed over the metal layer. An oxidized layer incidentally forms during the silicon containing layer formation and resides on the metal layer beneath the silicon containing layer. The silicon containing layer is removed. The oxidized layer residing on the metal layer is removed after removing the silicon containing layer.

10 Claims, 11 Drawing Sheets

INTERFACE-FREE METAL GATE STACK

FIELD OF THE INVENTION

The present invention generally relates to the field of semiconductors, and more particularly relates to high-k dielectric and metal gate transistors.

BACKGROUND OF THE INVENTION

High dielectric constant (high-k) transistors in conjunction with metal gates, or "MHK transistors", are undergoing active development in the industry. However, conventional fabrication techniques for MHK transistors generally result in defects intrinsic to metal contacts. The created during high temperature processing alter the threshold voltage (Vt) for device operation. This is especially acute for p-type devices. Charged oxygen vacancies are one main cause of Vt shifts. In a MHK transistor, any extrinsic oxygen that enters the formed high-k gate layer during subsequent processing changes the electrical properties of the MHK transistor. Conventional fabrication techniques do not effectively overcome these problems.

SUMMARY OF THE INVENTION

In one embodiment, a method of fabricating a transistor is disclosed. The method comprises forming a high dielectric constant layer on a semiconductor layer. A metal layer is formed on the high dielectric constant layer. A silicon containing layer is formed over the metal layer. A silicon dioxide layer incidentally forms during the silicon containing layer formation and resides on the metal layer beneath the silicon containing layer. A photoresist layer is formed on the silicon containing layer. The photoresist layer is selectively patterned. The selectively patterning defines a gate stack area. The high dielectric constant layer, the metal layer, the silicon dioxide layer, and the silicon containing layer are removed except for a portion of each of these layers under the photoresist layer after selectively patterning the photoresist layer. This removing forms a gate stack in the gate stack area comprising the portion of the high dielectric constant layer, the portion of the metal layer, the portion of the silicon dioxide layer, and the portion of the silicon containing layer. The photoresist layer is removed. A disposable spacer is formed around the gate stack. The portion of the silicon containing layer is removed. The portion of the silicon dioxide layer residing on the portion of the metal layer is removed, after removing the portion of the silicon containing layer, In another embodiment, a method of fabricating a gate stack for a transistor is disclosed. The method comprises forming a high dielectric constant layer on a semiconductor layer. A metal layer is formed on the high dielectric constant layer. A silicon containing layer is formed over the metal layer. An oxidized layer incidentally forms during the silicon containing layer formation and resides on the metal layer beneath the silicon containing layer. The silicon containing layer is removed. The oxidized layer residing on the metal layer is removed after removing the silicon containing layer.

In yet another embodiment, at least one transistor having at least one of an nFET gate stack, a pFET gate stack, and a combination thereof is disclosed. The at least one transistor comprises at least one gate stack. The at least one gate stack comprises a high dielectric constant layer formed on a semiconductor layer. A highly oxygenated metal layer is formed on the high dielectric constant layer. A top surface of the highly oxygenated metal layer is free of an oxidized layer formed thereon. A metal gate conductor is formed on the top surface of the highly oxygenated metal layer.

In another embodiment, a circuit supporting semiconductor substrate is disclosed. The circuit supporting semiconductor substrate comprises a circuit supporting substrate. At least one gate stack is disposed on the circuit supporting substrate. Each gate stack comprises a high dielectric constant layer formed on a semiconductor layer. A highly oxygenated metal layer is formed on the high dielectric constant layer. A top surface of the highly oxygenated metal layer is free of an oxidized layer formed thereon. A metal gate conductor is formed on the top surface of the highly oxygenated metal layer.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

FIGS. 1 to 11 illustrate a process for forming a interface-free high-k/metal gate transistor according to various embodiments of the present invention. In these figures an nFET transistor and a pFET transistor are shown arranged in a side-by-side manner for convenience of description. However, this is not meant to limit the present invention. Embodiments of the present invention can be directed to one or more nFET transistors, one or more pFET transistors, or a combination of these two types of transistors.

Figure 1:
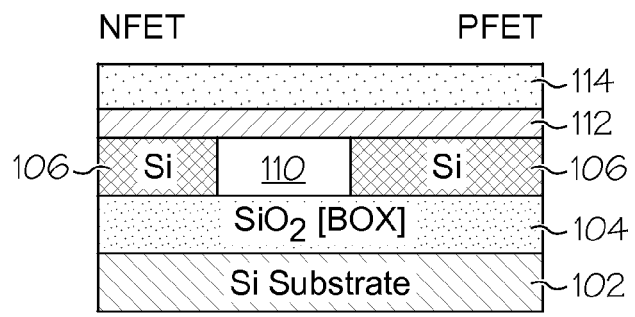
FIGS. 1 to 11 are cross-sectional views of a process for forming a transistor with an interface-free metal gate stack according to an embodiment of the present invention.

The process of one embodiment begins with a silicon-on-insulator (SOI) wafer that has a silicon substrate 102, an overlying oxide layer ("BOX") 104 (e.g., of 3 μm), and an overlying semiconductor layer 106, as shown in FIG. 1. The semiconductor layer 106 can comprise Si, Ge, SiGe, GaAs, InGaAs, SiC, or the like. One or more STI regions 110 are formed in the semiconductor layer 106. There is deposited a metal oxide or metal oxynitride dielectric layer whose dielectric constant (k) is greater than 3.9 to form a high-k dielectric layer 112 for the gate stack, as shown in FIG. 1. Examples of materials for this high-k dielectric layer 112 are $HfO_2$, HfSiO, HfSiON, HfZrO, $TiO_2$, $La_2O_3$, $Y_2O_3$, $Al_2O_3$, and mixtures thereof. In one embodiment, the dielectric constant (k) of the high-k dielectric layer is between 18 and 40. However, other dielectric constants are applicable as well. In one embodiment, a hafnium dioxide ($HfO_2$) layer with a k value in the range of about 20-25 (as compared to 3.9 for $SiO_2$) is deposited with an exemplary thickness in the range of about 1-3 nm.

A metal layer is then deposited to form a metal layer 114 for the gate stack. In one embodiment, the metal layer 114 is formed of a thermally stable metal, such as TiN, TaN, TaC, TiAlN, TaAlN, or their derivatives. In one embodiment, a titanium nitride layer (TiN) is deposited with an exemplary thickness of about 1-10 nm. In a more detailed example the thickness is about 2-5 nm. The high-k dielectric layer 112 and metal layer 114 together form the (as yet unpatterned) MHK gate stack. This initial structure represents an SOI CMOS with an MHK gate stack. In an alternative embodiment, a bulk silicon wafer is used in place of the SOI wafer.

Figure 2:
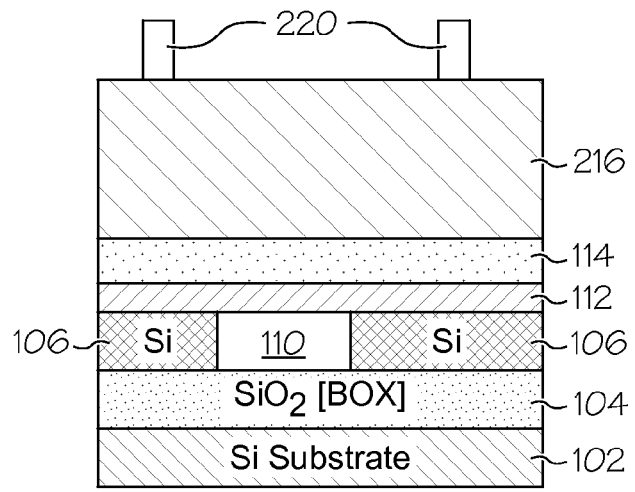

FIG. 2 shows the structure after the deposition of an amorphous silicon (or polysilicon) layer 216 having an exemplary thickness in the range of about 20-100 nm, and the subsequent deposition and patterning of a photoresist layer 220. The photoresist 220 is left where a device gate stack is desired to be formed. In other words, the photoresist 220 defines a gate stack area.

Figure 3:
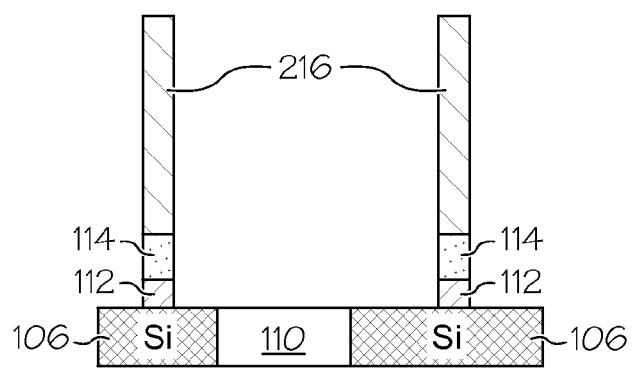

FIG. 3, which is a partial view that does not include the silicon substrate 102 and oxide layer 104 for simplicity, shows the result after a gate stack etch and subsequent removal of the photoresist 220. In this embodiment, the gate stack etch is performed in one step: a single etch that stops on the semiconductor layer 106. In an alternative embodiment, the gate stack is etched in two steps: a first etch of the metal layer 114 that stops at the high-k layer 112, and a second etch of the high-k layer 112 that stops at the semiconductor layer 106.

The resulting gate stack is formed by the high-k layer 112, the metal layer 114, and the polysilicon layer 216. In the gate stack of this embodiment, a lateral extent (width) of the high-k layer 112 is the same as a lateral extent (width) of the metal and silicon layers 114 and 216.

Figure 4:
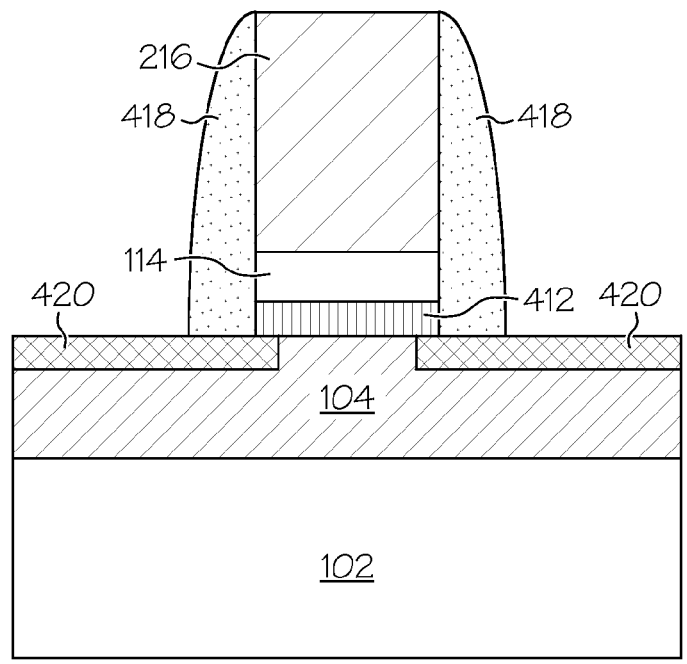

After the gate stack is etched, a disposable spacer 418 is formed on sidewalls of the gate stack, as shown in FIG. 4. It should be noted that FIG. 4 only shows one transistor for simplicity. The disposable spacer 418 of this embodiment is a nitride spacer that is formed by depositing a 5-50 nm thick nitride layer (e.g., using RTCVD or PECVD) and then performing a reactive ion etch (RIE) that stops on an underlying oxide liner so as not to consume any of the underlying silicon. Photolithography and ion implantation are then used to define source/drain extension. For an nFET the implant is performed using an n-type species, and for a pFET the implant is performed using a p-type species. Thus, source/drain extensions 420 are formed.

Figure 5:
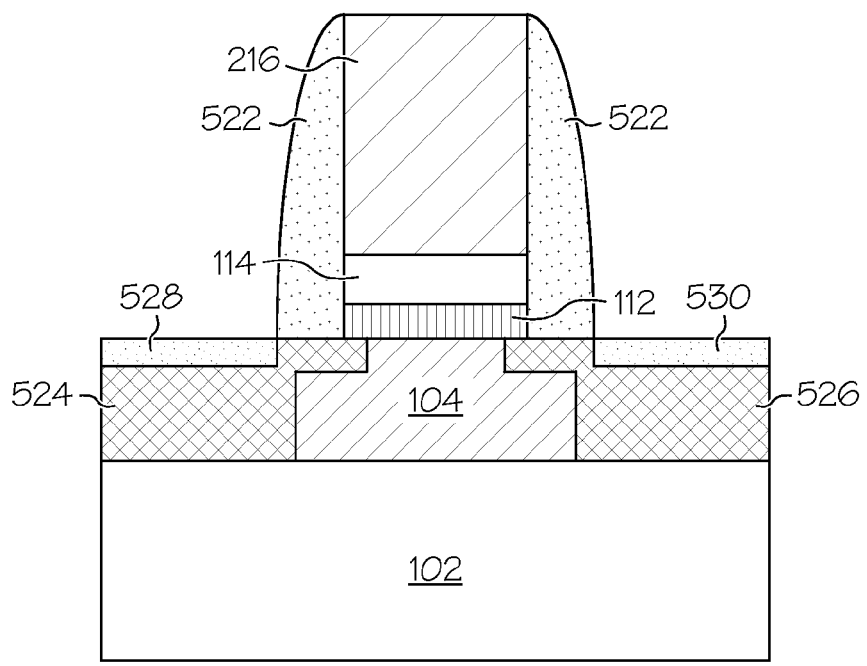

The disposable spacer 418 that was used to offset the ion implantation from the gate edge is then removed, such as through a hot phosphoric acid etch, other wet dip process, or through a highly selective RIE etch. As shown in FIG. 5, an oxide and/or nitride diffusion spacer 522 is formed by depositing and etching one or more layers of nitride and/or oxide (for example, using PECVD). The diffusion spacer 522 of this embodiment has an exemplary thickness of about 2-10 nm. Source and drain regions are then implanted. The source/drain implant is performed using a p-type species for an nFET (for example, As or P) or using an n-type species for a pFET (for example, B or $BF_2$). A subsequent rapid thermal anneal (RTA) is performed (e.g., millisecond laser anneal or flash anneal) to provide relatively deep diffusions for the source and drain regions 524, 526 which are separated by the gate region.

Figure 6:
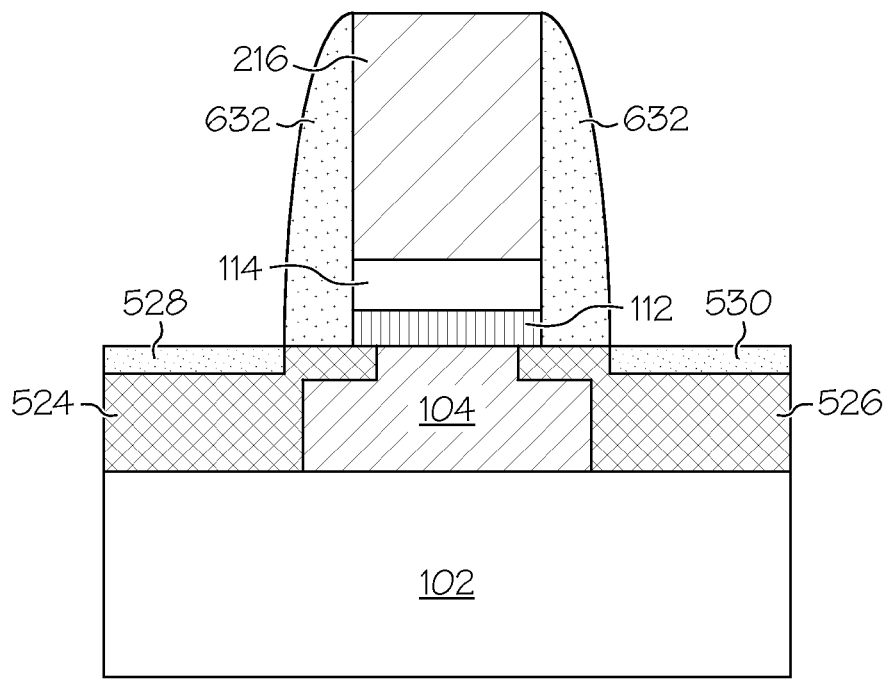

Conventional processing is then used to silicide the source and drain (typically with Ni or Co) of the transistor, as shown in FIG. 5. The silicide contact areas 528, 530 are formed using the diffusion spacer 522 for alignment. In particular, a portion for the contact area is removed (e.g., through a wet etch using HF), a metal is deposited, an anneal is performed to form silicide, and then the metal is selectively removed so as to leave the silicide (e.g., through an aqua regia wet etch). In this exemplary embodiment, the metal is nickel, cobalt, titanium, or platinum. After the silicide contact areas 528, 530 have been formed, the diffusion spacer 522 is removed, such as through RIE. An oxide and/or nitride sidewall spacer 632 is then formed by depositing and etching one or more layers of nitride and/or oxide (for example, using PECVD), as shown in FIG. 6.

As discussed above, a difficulty commonly encountered in high-k/metal gate devices is that the threshold voltage for device operation (Vt) is too high in devices that have undergone high-temperature processing. One method of overcoming this problem is by supplying oxygen to the device. This results in a high Vt caused by charged oxygen vacancies in the dielectric. Supplying oxygen fills the vacancies, removes the charge, and reduces Vt. Therefore, after the sidewall spacer 632 is formed one or more embodiments provide further fabrication processes that result in a structure with a maximum flow of oxygen into the device.

For example, in one embodiment, once ion implantation, activation anneals, and sidewall deposition is performed, as discussed above, the polysilicon layer 216 is etched away to expose the MHK gate stack comprising the high-k dielectric layer 112 and the metal layer 114. The polysilicon layer 216 is removed so that a re-oxidizing process can be performed to introduce oxygen into the MHK gate stack. This re-oxidizing process substantially removes charged defects from the high-k gate dielectric 112.

However, the inventors have discovered that there is an inadvertent layer of SiO2 on top of the MHK gate stack due to the way devices are fabricated. For example, between MHK gate stack deposition and polysilicon deposition, there is typically air exposure. Furthermore, oxygen is often unintentionally introduced in the early stages of polysilicon deposition.

Figure 7:
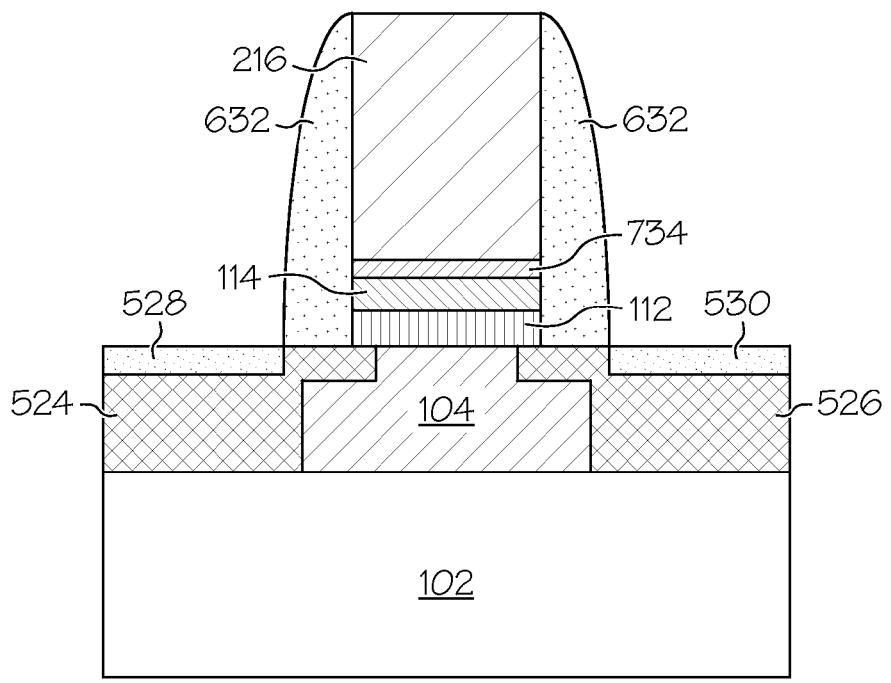

This oxygen migrates to the MHK gate stack/poly interface, creating a thin oxidized layer 734 such as an SiO2 layer, as shown in FIG. 7.

Figure 8:
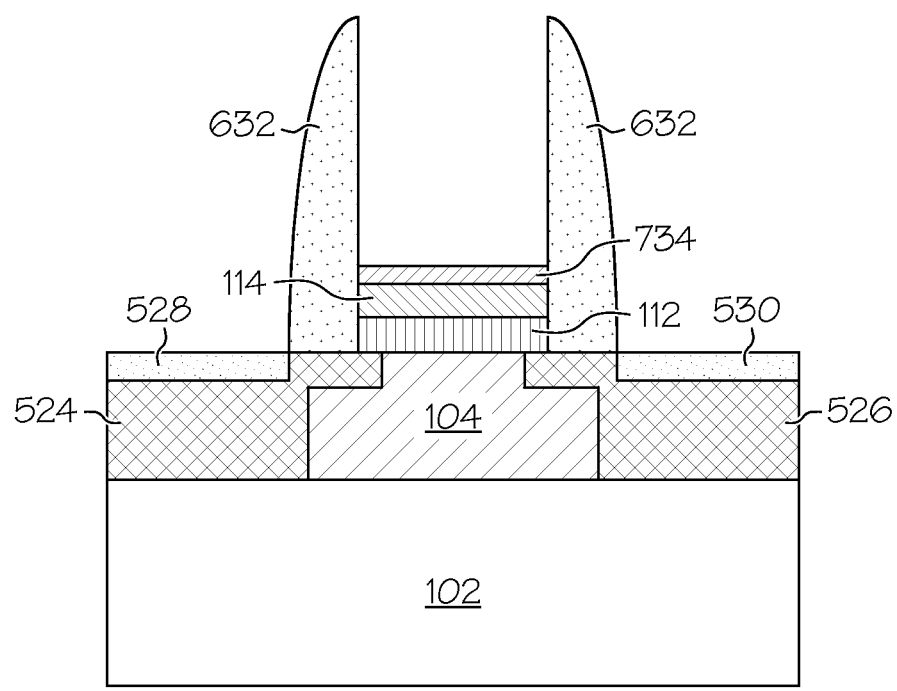

As discussed above, the polysilicon layer 216 is etched away in a subsequent fabrication process to expose the MHK gate stack comprising the high-k dielectric layer 112 and the metal layer 114 so that the re-oxidizing process can be performed. FIG. 8 shows the device after the polysilicon layer 216 has been removed. The polysilicon layer 216 can be removed by, for example, dry etching (i.e., RIE), wet etching, or a combination of wet/dry etching techniques. However, this etching process selectively removes Si, but not $SiO_2$ 734, as shown in FIG. 8. This selectivity is needed to maintain the integrity of the sidewalls, device isolation, etc. Typically, tetramethylammonium hydroxide (TMAH) etching is used at elevated temperatures, although other etchants such as Heated Potassium Hydroxide (KOH) may be used.

The inventors have discovered that if there is a layer 734 on the MHK gate stack that slows the diffusion of oxygen (e.g. $SiO_2$), this layer 734 causes fabrication of pFETs to be more difficult. Not only will more oxygen be needed, but also a higher thermal processing budget results. Vt will be higher because oxygen vacancies are created during oxygenation. This inadvertent $SiO_2$ 734 layer impedes oxygen flow, but can be removed by wet etching as discussed with respect to one or more embodiments below. If the $SiO_2$ is removed, oxygen flows into the dielectric at a lower temperature, and also a lower Vt is achieved. Thus, various embodiments of the present invention provide a replacement-gate stack that is free of $SiO_2$ at the metal/metal interface (the MHK gate stack and subsequent metal gate conductor 1138 (FIG. 11)).

Figure 13:
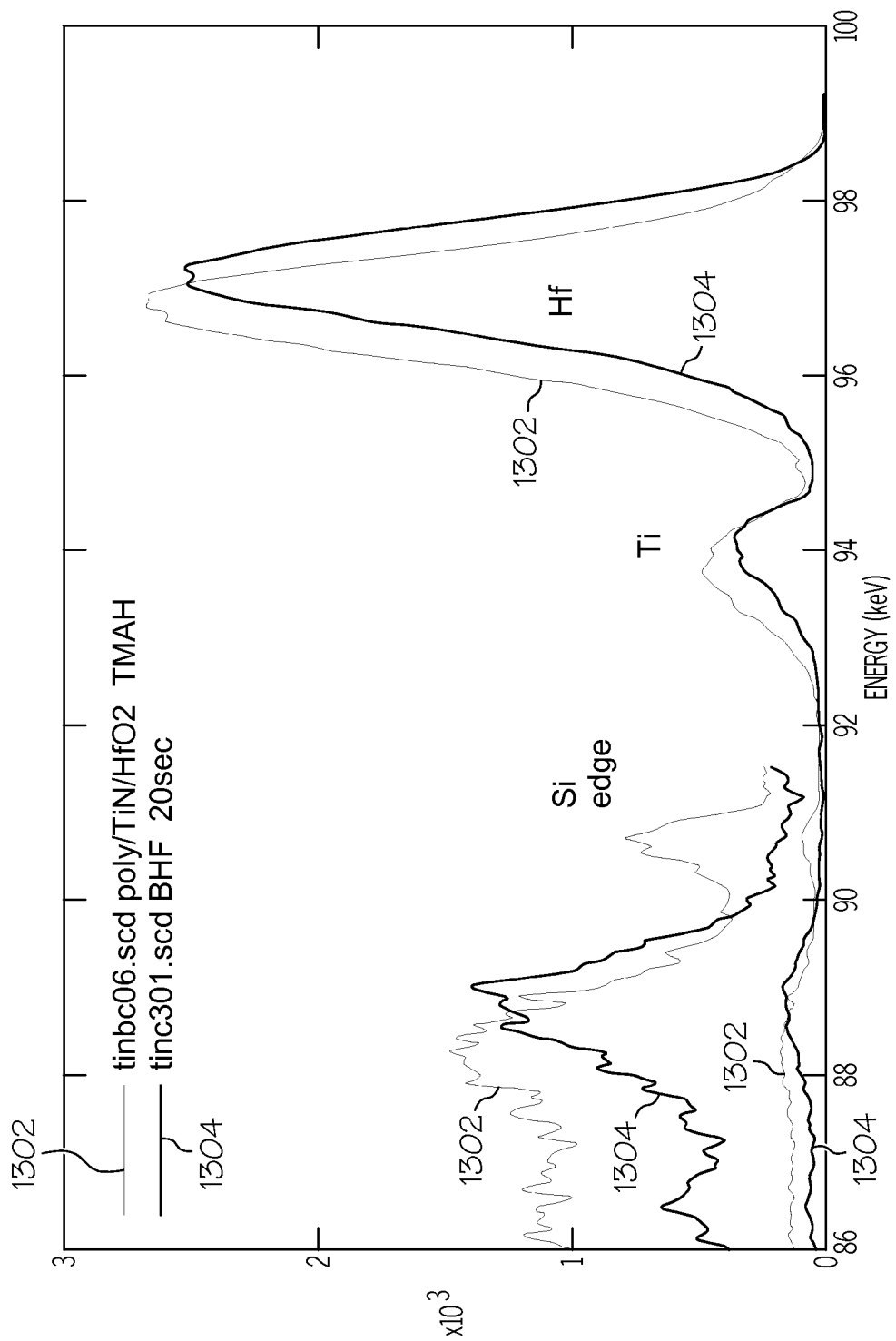
FIG. 13 is a graph illustrating that a remnant $SiO_2$ exists between a metal layer and a polysilicon layer of a high-k metal gate stack.

Evidence of the remnant $SiO_2$ layer 734 can be found using medium energy ion scattering (MEIS), as shown in FIG. 13. An unpatterned sample that has undergone processing through poly strip is shown in FIG. 13. A silicon peak can be seen (labeled "Si edge"), which is due to 8 Å of SiO2 lying on top of the TiN MHK gate stack (lines 1302). After a 20 sec exposure to dilute BHF, the $SiO_2$ is completely removed while the TiN remains (lines 1304).

Figure 9:
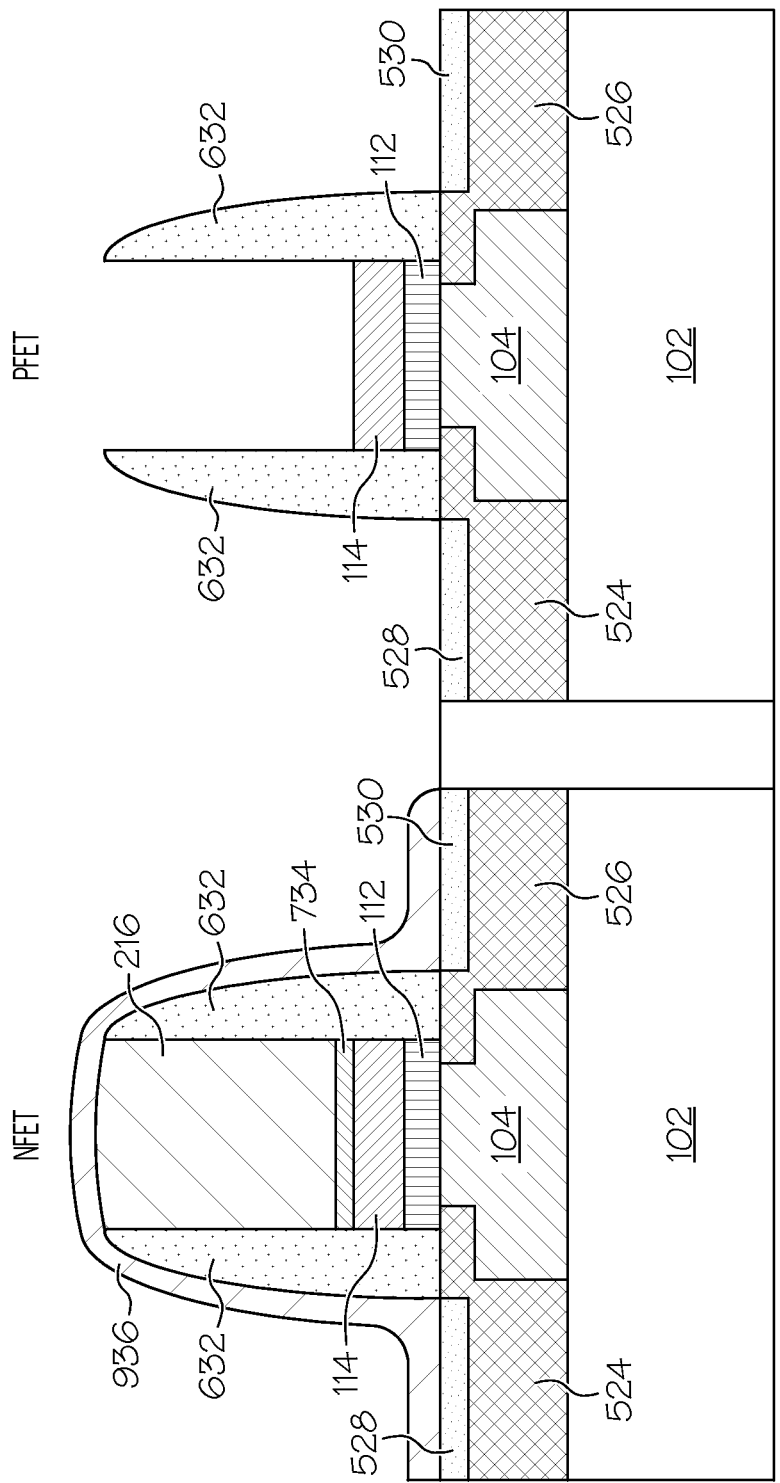

Therefore, one or more embodiments of the present invention selectively remove the $SiO_2$ layer 734 that is formed on the MHK gate stack. In one embodiment, the $SiO_2$ is only removed from the pFETs, but left intact on the nFETs. This can be done by masking the nFETs from the etch using photoresist as shown in FIG. 9. In particular, FIG. 9 shows that a conventional mask material 936 has been formed on the nFET region only utilizing a conventional deposition process followed by lithography and etching. It should be noted that, in one embodiment, the mask material 936 is deposited on the nFET prior to the process discussed above with respect to FIG. 8 for removing the polysilicon layer 216.

FIG. 9 also shows that the $SiO_2$ layer 734 on the pFET has been removed, for example, by an HF strip process while the mask 936 prevented the polysilicon layer 936 and the $SiO_2$ layer 734 on nFET from being removed. The advantage of this embodiment is that while oxygen is being introduced to the pFET (as discussed in greater detail below), the $SiO_2$ is acting to mask the nFET and keep the oxygen away from them. This reduces the threshold for device operation in both the pFETs and nFETs. In one or more alternative embodiments, the mask layer 936 is not deposited over the NFET and the polysilicon layer 216 is removed from both the pFET and nFET followed by an HF strip of the $SiO_2$ layer 734 on the pFET and nFET.

Figure 10:
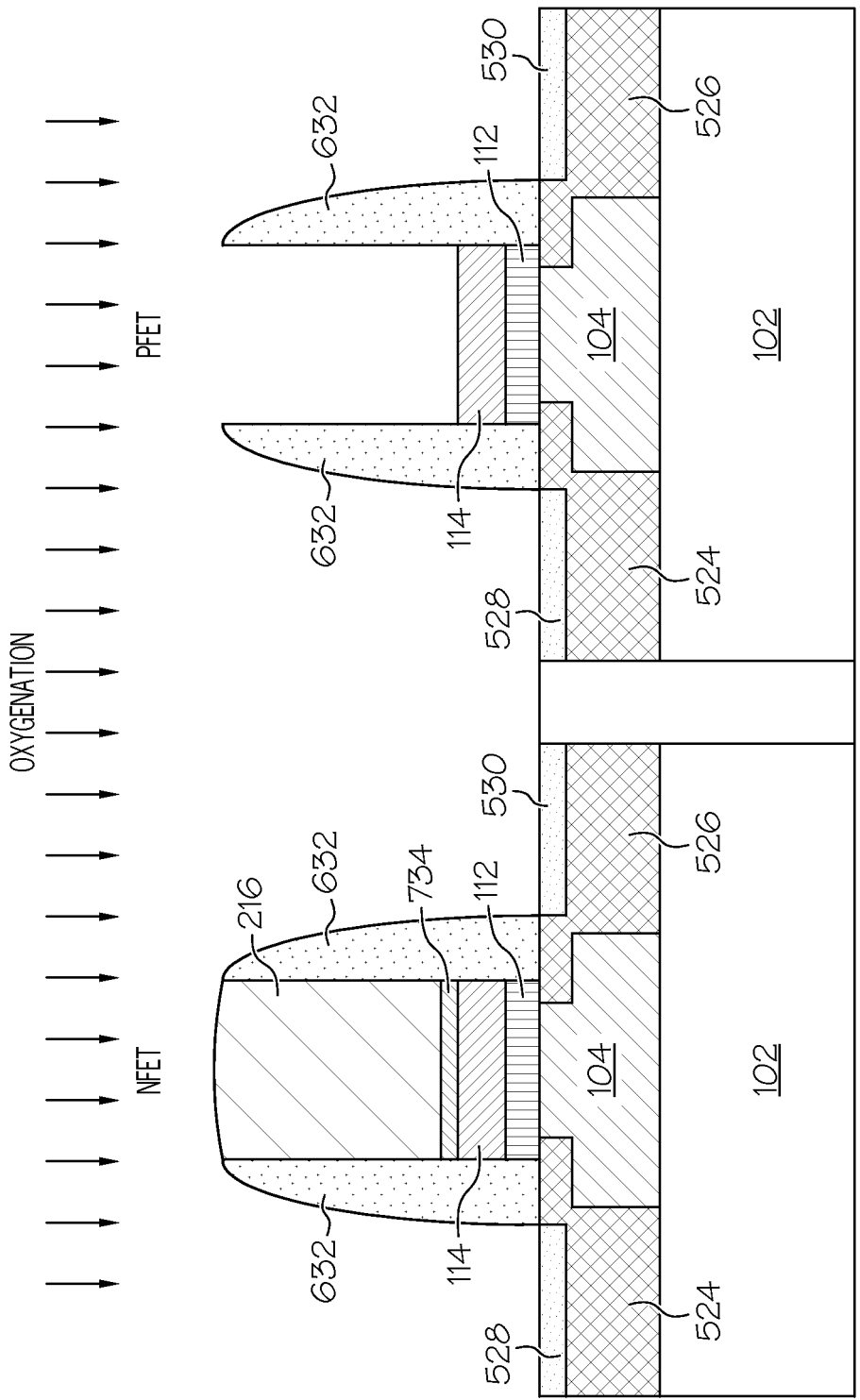
Figure 11:
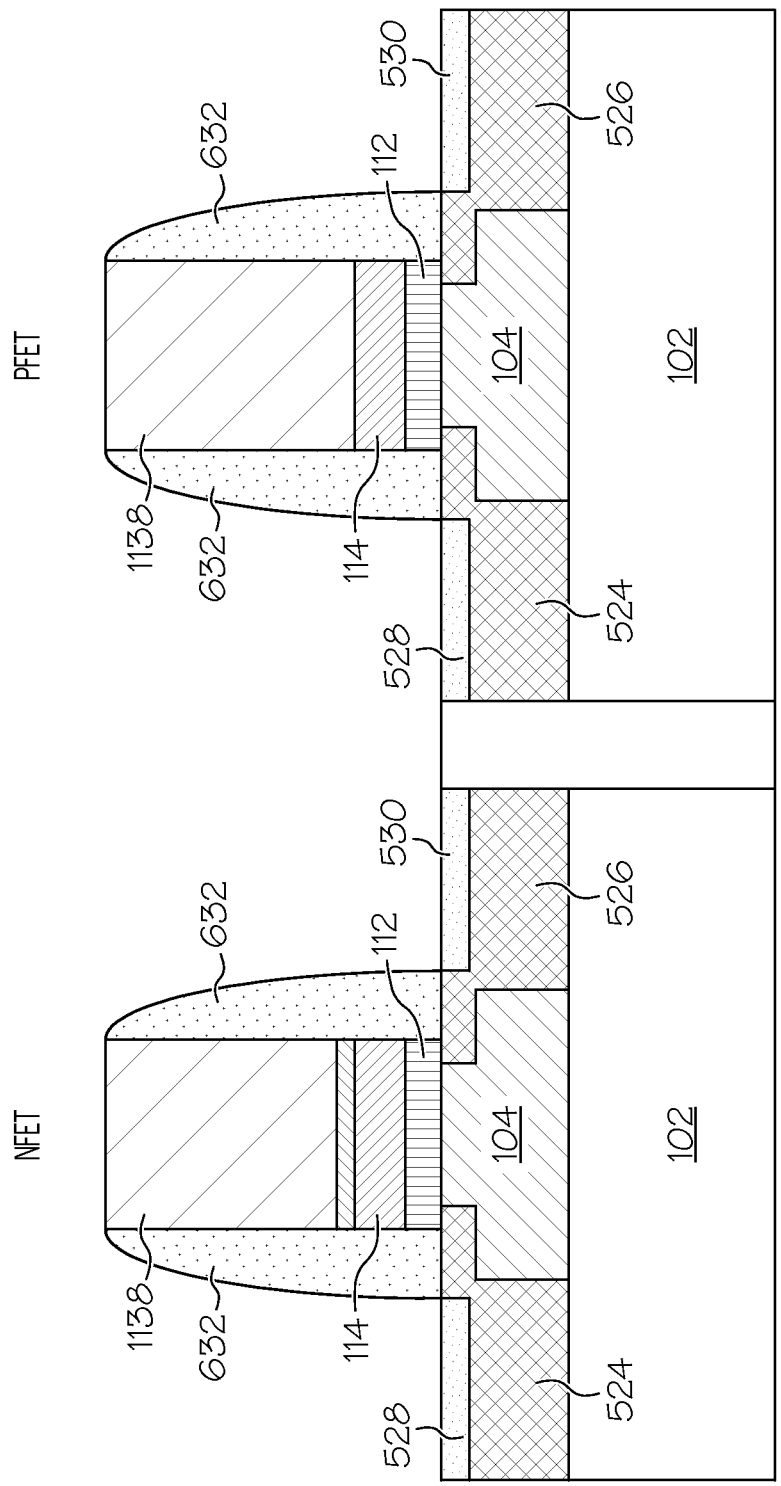

In the embodiment where the polysilicon layer 216 and $SiO_2$ layer 734 are removed from the pFET only, once the removal of the $SiO_2$ layer 734 from the pFET is performed, the mask layer 936 is removed from the nFET and oxygen is introduced (re-oxidizing process) into the MHK gate stack of the pFET by exposure to $O_2$ or other oxidizing agent, which can be a gas, liquid, plasma, etc., at elevated temperatures or by deposition of an oxygen-containing metal, as shown in FIG. 10. Once the oxygen has been introduced in the MHK gate stack of the pFET the polysilicon layer 216 of the nFET is removed (not shown). In the alternative embodiments where the polysilicon layer 216 and $SiO_2$ layer 734 are removed from both the pFET and nFET, oxygen is introduced into the MHK gate stack of both the pFET and nFET.

The oxidizing agent (e.g., oxygen) is introduced in such a way so that oxygen diffuses through the MHK gate stack and reaches the high-k dielectric layer 112. Further discussions of oxygen diffusion through the MHK gate stack are given in "Oxygen Passivation of Vacancy Defects In Metal-Nitride gated $HfO_2/SiO_2$/Si Devices", E. Cartier et al. Appl. Phys. Lett. 95, 042901 (2009); and "Quasi-Damascene Metal Gate/ High-k CMOS Using Oxygenation Through Gate Electrodes", Choi, et al, Microelectronic Engineering, 86, 1737, (2009), which are hereby incorporated by reference in their entireties.

The re-oxidizing process is performed, in one embodiment, by exposing the structure(s) including the now exposed metal MHK gate stack to diluted oxygen at a temperature from about 200° C. to about 450° C. for a time period from about 1 minute to about 24 hours. More typically, the re-oxidizing process is performed in diluted oxygen at a temperature from about 300° C. to about 400° C. for a time period from about 10 minutes to about 60 minutes. The diluted oxygen includes an oxygen source such as $O_2$ that is diluted with an inert gas such as He, Ar, $N_2$, Ne, Kr, Xe, or any combination thereof. The diluted oxygen employed in this embodiment typically has an $O_2$ partial pressure of about 100 Torr or less, with an $O_2$ concentration from about 1 to about 100 parts per million (ppm) being even more typical. It is noted that the above re-oxidizing step substantially removes charged defects from the high-k gate dielectric 112.

After the re-oxidizing process discussed above, conventional fabrication processes can be used to complete the device. For example, a metal gate conductor is formed on the structure. For example, the metal gate conductor is formed on the MHK gate stack where the polysilicon layer 216 resided prior to being removed. Therefore, a bottom portion of the metal gate conductor is formed on an upper portion of the metal layer 114 of the MHK gate stack. The metal gate conductor is formed utilizing a conventional deposition process including, for example, CVD, PECVD, plating, reactive sputtering, MOCVD, ALD, evaporation, chemical solution deposition, and other like deposition processes. It is noted that the deposition used in forming the metal gate conductor can be performed at low temperatures (on the order of about 550° C. or less) to avoid introduction of oxygen vacancies into the high-k gate dielectric. The thickness of the metal gate conductor is sufficient enough to fill in the opening in FET region where the polysilicon layer was removed.

The metal gate conductor may comprise an elemental metal, an alloy (e.g., binary or ternary) of an elemental metal, a nitride of an elemental metal, a silicide of an elemental metal, a conductive oxide or any combination thereof. Examples of metal gate conductors 38 include, but are not limited to: Al, TiN, TaN, W, Co, Ni, Cu, Cr, Mo and other like materials that include a low resistivity metal (on the order of about 50 microOhm*cm or less) and that can be deposited at low temperatures (less than about 550° C. to avoid the reversibility of the aforementioned oxidation step.

After depositing the metal gate conductor 1138, the structure is subjected to a planarization process such as CMP or grinding. The resultant structure formed after the planarization step has been performed is shown, for example, in FIG. 11.

Figure 12:
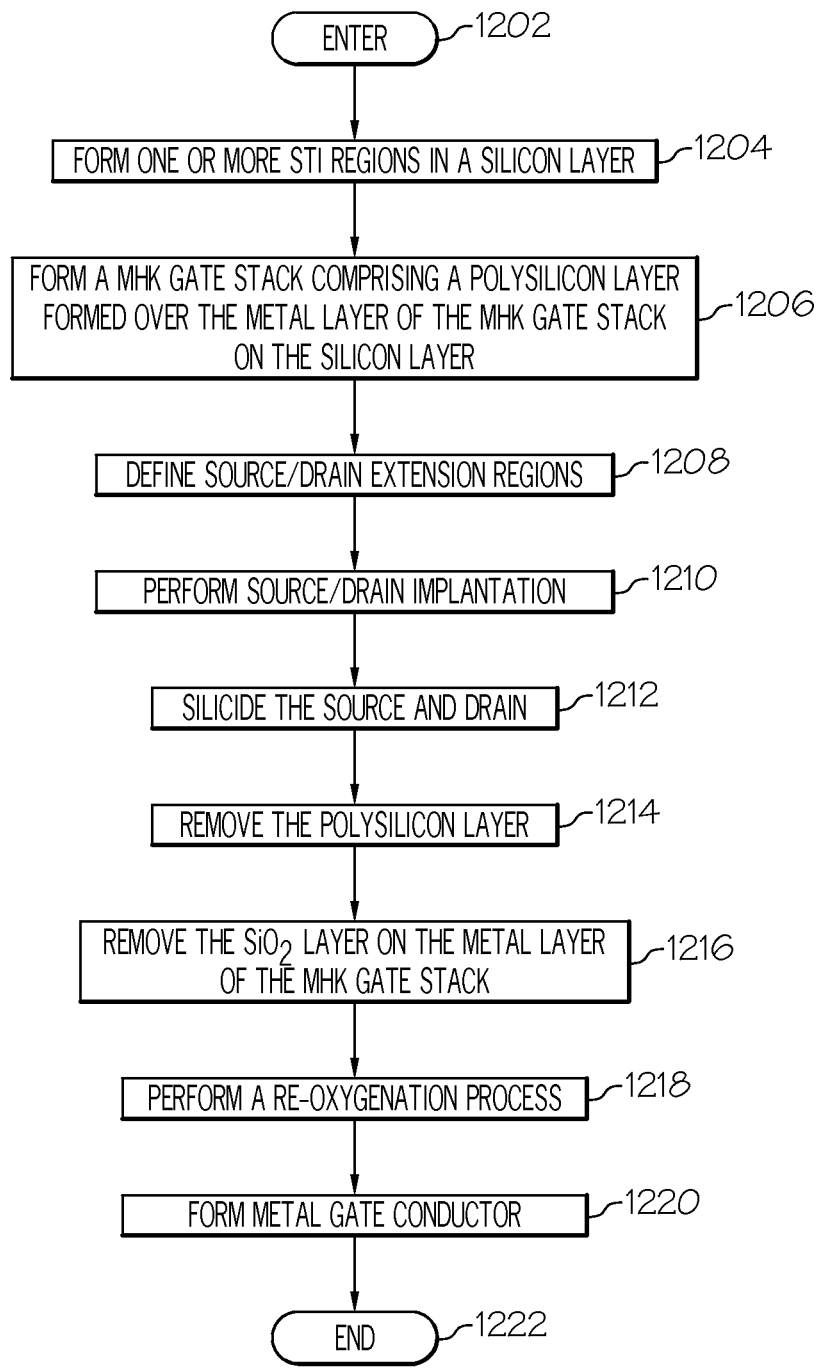
FIG. 12 is an operational flow diagram illustrating one example of fabricating an transistor device with an interface-free high-k metal gate stack according to one embodiment of the present invention.

FIG. 12 is an operational flow diagram illustrating one example of forming a device with an interface-free metal gate stack. The operational flow diagram of FIG. 12 begins at step 1202 and flows directly to step 1204. One or more STI regions 110, at step 1204, are formed in the semiconductor layer 106. This process is discussed above in greater detail with respect to FIG. 1. An MHK gate stack comprising a high-k dielectric layer 112, a metal layer 114, and a polysilicon layer 216 are formed on the semiconductor layer 106. This process is discussed above in greater detail with respect to FIGS. 1-3.

Source/drain extensions regions 420 are then formed. This process is discussed above in greater detail with respect to FIG. 4. Source/drain implantation, at step 1210, is then performed. This process is discussed above in greater detail with respect to FIG. 5. The source/drain, at step 1212, are then silicided. This process is discussed above in greater detail with respect to FIG. 5. The polysilicon layer 216, at step 1214, is then removed. This process is discussed above in greater detail with respect to FIGS. 8-10. The $SiO_2$ layer 734 on the metal layer 114, at step 1216, is then removed. This process is discussed above in greater detail with respect to FIGS. 9-10. A re-oxygenation process, at step 1218, is then performed. This process is discussed above in greater detail with respect to FIG. 10. A metal gate 1138, at step 1220, is then formed where the polysilicon layer 216 was removed. This process is discussed above in greater detail with respect to FIG. 11. The control flow then exits at step 1222.

Figure 14:
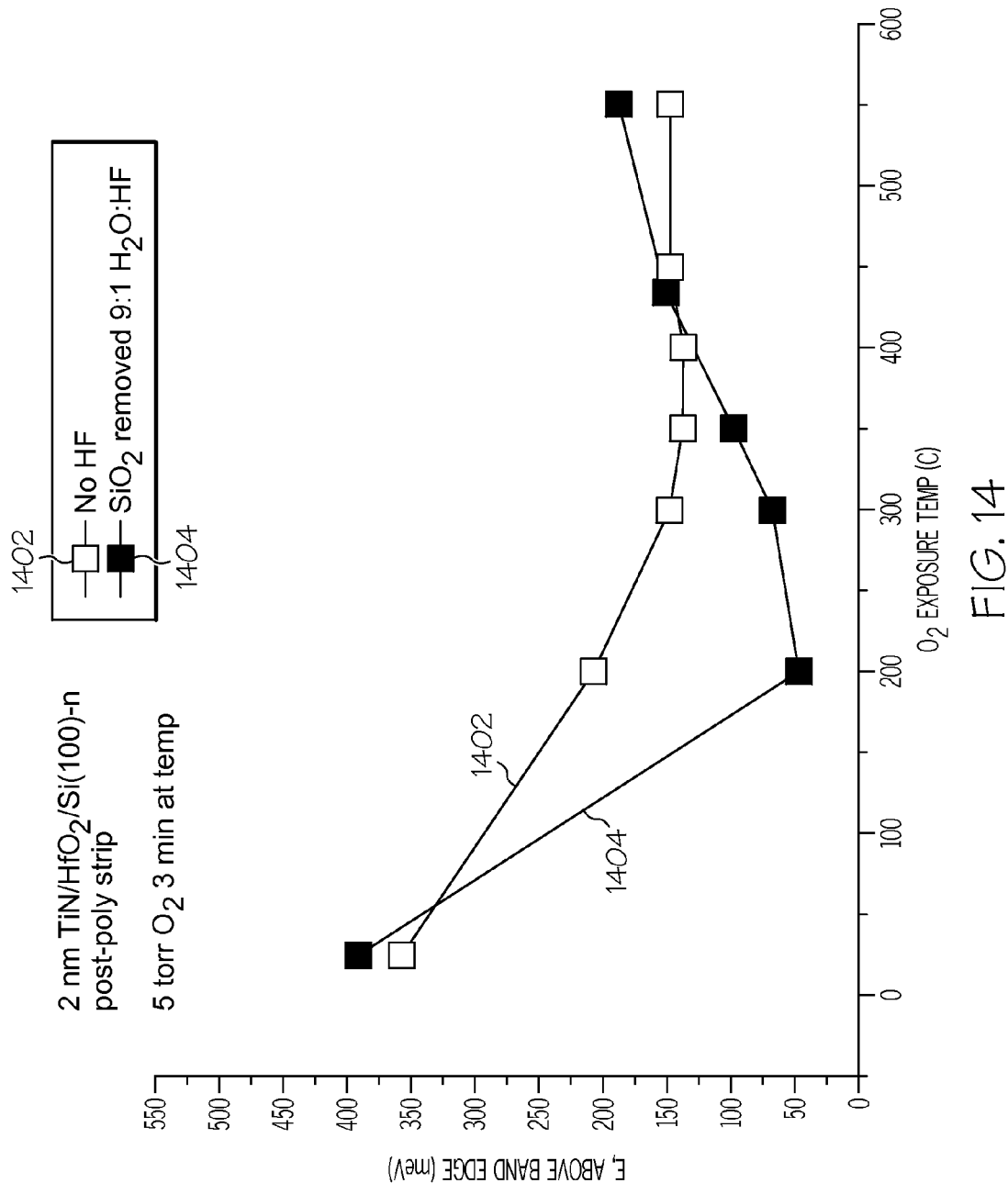
FIGS. 14-15 are charts illustrating how various embodiments of the present invention result in a device's Fermi level being closer to the valence band edge as compared to conventional fabrication methods.

Band-bending measurements using pulsed laser pump/probe UV photoemission gives evidence that the removal of $SiO_2$ improves oxygen flow into devices. Blanket films of Poly/TiN/$HfO_2$ were prepared and stripped with TMAH, as in the MEIS measurements. FIG. 14 shows the location of the interfacial Fermi level for a sample with a residual $SiO_2$ layer (blocks on line set 1402) and the same sample after the $SiO_2$ was removed with the BHF (blocks on line set 1404. For both samples the sequence of measurements involved measuring the location of the Fermi level at the interface, then exposing the sample to 5 torr $O_2$ for 3 minutes at increasing temperatures, then measuring again to locate the Fermi level. For both cases it can be seen that the Fermi level approaches the valence band edge with increasing $O_2$ exposure and temperature (equivalent to a reduction in Vt). However, for the case with the residual $SiO_2$ layer, the minimum is further from the valence band edge and occurs at a higher temperature than for the case where the $SiO_2$ layer has been removed. This simple result shows clearly that the $SiO_2$ layer inhibits the diffusion of $O_2$ through the TiN layer limiting the removal of the charged oxygen vacancies in the high-K material. With the $SiO_2$ removed, the Fermi level is nearly at the valence band edge (highly desired) corresponding to an optimal Vt and represents a critical improvement in achieving a band-edge Vt in p-FET performance.

Figure 15:
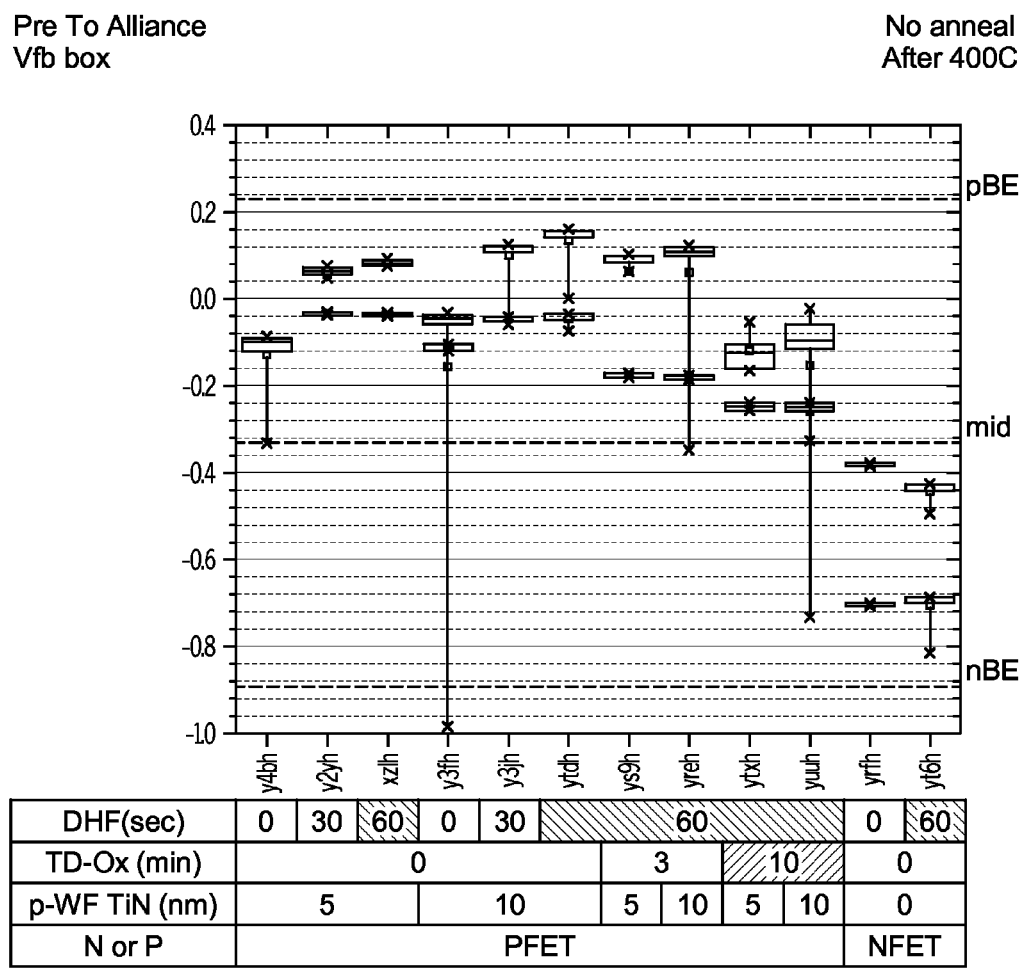

FIG. 15 also shows a graph illustrating the advantages of various embodiments of the present invention. In particular, FIG. 15 shows for devices with the residual $SiO_2$ layer 734 removed by embodiments of the present invention, the Fermi levels of the device are closer to the pBE (valence band edge) than devices without the residual $SiO_2$ layer removed.

It should be noted that the process discussed above with respect to FIGS. 1-12 can be performed by one or more information processing systems that can comprise, inter alia, at least a computer readable storage medium allowing a computer to read data, instructions, messages or message packets, and other computer readable information from the computer readable storage medium to perform the process discussed above. The computer readable medium can comprise non-volatile memory, such as ROM, Flash memory, floppy disk, Disk drive memory, CD-ROM, and other permanent storage. Additionally, a computer readable medium can include, for example, volatile storage such as RAM, buffers, cache memory, and network circuits.

Furthermore, the computer readable medium can comprise computer readable information in a transitory state medium such as a network link and/or a network interface, including a wired network or a wireless network that allows a computer to read such computer readable information.

The embodiments of the present invention described above are meant to be illustrative of the principles of the present invention. These MHK device fabrication processes are compatible with CMOS semiconductor fabrication methodology, and thus various modifications and adaptations can be made by one of ordinary skill in the art. All such modifications still fall within the scope of the present invention.

For example, while the exemplary embodiments of the present invention described above relate to gate structures that use hafnium dioxide for the high-k layer and titanium nitride for the metal layer, further embodiments can use other compatible materials, such as $ZrO_2$ or $HfSi_xO_y$, which both exhibit the high dielectric constant (e.g., k of approximately 20-25) needed to provide a larger equivalent oxide thickness. Similarly, other metal oxide-based materials may be used, such as a uniform or a composite layer comprised of one or more of $Ta_2O_5$, $TiO_2$, $Al_2O_3$, $Y_2O_3$ and $La_2O_5$. The metal-containing layer 114 could also be formed of another material, such as one or more of Ta, TaN, TaCN, TaSiN, TaSi, W, and Mo. Additionally, the upper layer 312 of the gate stack can be comprised of any material that is able to be etched, remain conductive, and withstand high temperatures. Similarly, while the embodiments described above relate to a transistor on an SOI wafer, the transistors and fabrication methods of the present invention are also applicable to bulk technologies. Likewise, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit elements as described above are part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as discussed above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A method for fabricating at least one transistor, the method comprising:
    forming a metal layer on a high dielectric constant layer formed on a semiconductor layer;
    forming a silicon containing layer over the metal layer, wherein a silicon dioxide layer incidentally forms during the silicon containing layer formation and resides on the metal layer beneath the silicon containing layer;
    forming a first gate stack for a pFET region, wherein the first gate stack comprises a first portion of the metal layer and a first portion of the silicon containing layer, and wherein a first portion of the silicon dioxide layer resides on the first portion of the metal layer;
    forming a second gate stack for an nFET region, wherein the second gate stack comprises a second portion of the metal layer and a second portion of the silicon containing layer, and wherein a second portion of the silicon dioxide layer resides on the second portion of the metal layer;
    selectively removing the first portion of the silicon containing layer; and
    thereafter, removing the first portion of the silicon dioxide layer residing on the first portion of the metal layer while maintaining the second portion of the silicon dioxide layer on the second portion of the metal layer.

2. The method of claim 1, wherein the metal layer comprises a metal alloy.

3. The method of claim 1, wherein the silicon containing layer comprises at least one of silicon and polysilicon.

4. The method of claim 1, further comprising:
    exposing at least the first portion of the metal layer to an oxidizing agent after removing the first portion of the silicon dioxide layer.

5. The method of claim 4, wherein the exposing comprises:
    exposing, after removing the first portion of the silicon dioxide layer, the first portion of the metal layer to the oxidizing agent comprising oxygen in such a way so that oxygen diffuses through the first portion metal layer and reaches the first portion of the high dielectric constant layer.

6. The method of claim 4, further comprising:
    depositing a mask material over the nFET region including the entire second gate stack prior to removing the first portion of the silicon containing layer from the first gate stack of the pFET region, wherein the mask material is separate from the second portion of the silicon dioxide layer;
    thereafter, removing the first portion of the silicon containing layer from the first gate stack and the first portion of the silicon dioxide layer residing on the first portion of the metal layer of the first gate stack;
    thereafter removing the mask material prior to exposing the first portion of the metal layer of the first gate stack to the oxidizing agent; and
    thereafter removing the second portion of the silicon containing layer of the second gate stack.

7. The method of claim 6, wherein the mask material and the second portion of the silicon containing layer are removed prior to forming a metal gate conductor on the first portion of the metal layer.

8. A method for fabricating a gate stack for a transistor, the method comprising:
    forming a metal layer on a high dielectric constant layer formed on a semiconductor layer;
    forming a silicon containing layer over the metal layer, wherein a silicon dioxide layer incidentally forms during the silicon containing layer formation and resides on the metal layer beneath the silicon containing layer;
    forming a first gate stack for a pFET region, wherein the first gate stack comprises a first portion of the metal layer and a first portion of the silicon containing layer, and wherein a first portion of the silicon dioxide layer resides on the first portion of the metal layer;
    forming a second gate stack for an nFET region, wherein the second gate stack comprises a second portion of the metal layer and a second portion of the silicon containing layer, and wherein a second portion of the silicon dioxide layer resides on the second portion of the metal layer;
    selectively removing the first and second portions of the silicon containing layer; and
    thereafter, removing both the first and second portions of the silicon dioxide layer residing on the first and second portions of the metal layer, respectively.

9. The method of claim 7, wherein the silicon containing layer comprises silicon or polysilicon.

10. The method of claim 8, wherein the method further comprises:
    exposing the first and second portions of the metal layer to an oxidizing agent after removing the first and second portions of the silicon dioxide layer.

* * * * *